United States Patent
Kawaguchi et al.

(10) Patent No.: US 9,144,152 B2
(45) Date of Patent: Sep. 22, 2015

(54) COVER LAY FILM AND FLEXIBLE PRINTED WIRING BOARD

(71) Applicant: Shin-Etsu Polymer Co., Ltd., Tokyo (JP)

(72) Inventors: Toshiyuki Kawaguchi, Tokyo (JP); Kazutoki Tahara, Saitama (JP); Tsutomu Saga, Saitama (JP); Minoru Kubota, Saitama (JP); Masashi Higuchi, Itoigawa (JP)

(73) Assignee: SHIN-ETSU POLYMER CO., LTD. (JP)

( * ) Notice: Subject to any disclaimer, the term of this patent is extended or adjusted under 35 U.S.C. 154(b) by 63 days.

(21) Appl. No.: 14/042,757

(22) Filed: Oct. 1, 2013

(65) Prior Publication Data

US 2014/0098501 A1    Apr. 10, 2014

(30) Foreign Application Priority Data

Oct. 4, 2012   (JP) ................................. 2012-222118

(51) Int. Cl.
| | |
|---|---|
| *H05K 1/00* | (2006.01) |
| *H05K 1/02* | (2006.01) |
| *H05K 9/00* | (2006.01) |
| *H05K 1/03* | (2006.01) |

(52) U.S. Cl.
CPC ............ *H05K 1/0277* (2013.01); *H05K 1/0218* (2013.01); *H05K 1/0257* (2013.01); *H05K 9/0086* (2013.01); *H05K 1/0393* (2013.01)

(58) Field of Classification Search
USPC .......................................... 361/750; 174/382
See application file for complete search history.

(56) References Cited

FOREIGN PATENT DOCUMENTS

| JP | 02-033999 | 2/1990 | |
|---|---|---|---|
| JP | 2000-269632 | 9/2000 | |
| JP | 2009-283901 | * 3/2009 | ............... H05K 3/28 |
| JP | 2009-283901 | 12/2009 | |

* cited by examiner

*Primary Examiner* — Andargie M Aychillhum
(74) *Attorney, Agent, or Firm* — Ostrolenk Faber LLP

(57) ABSTRACT

A cover lay film includes an electromagnetic wave shielding layer formed of a conductive material, a resistor layer having a greater surface resistance than the electromagnetic wave shielding layer, and an insulating resin layer provided between the electromagnetic wave shielding layer and the resistor layer, wherein a plurality of openings penetrating in a thickness direction of the electromagnetic wave shielding layer are provided in the electromagnetic wave shielding layer.

7 Claims, 7 Drawing Sheets

COVER LAY FILM AND FLEXIBLE PRINTED WIRING BOARD

BACKGROUND OF THE INVENTION

1. Field of the Invention

The present invention relates to a cover lay film having an electromagnetic wave shielding function and a flexible printed wiring board including the same.

Priority is claimed on Japanese Patent Application No. 2012-222118, filed Oct. 4, 2012, the entire content of which is incorporated herein by reference.

2. Description of Related Art

Since an electromagnetic wave noise generated from a flexible printed wiring board, electronic parts or the like may affect other electric circuits or electronic parts and cause a malfunction thereof or the like, it is necessary to shield the electromagnetic wave noise. Therefore, electronic devices or flexible printed wiring boards have been given a wave shielding function.

Further, with the miniaturization and multifunctionalization of electronic devices including a flexible printed wiring board, a space allowed for the flexible printed wiring board becomes smaller. Therefore, thinning and a reduced bending radius are required for the flexible printed wiring board, and functioning without breaking wiring conductors under a severe bending condition is required.

For example, the following flexible printed wiring boards are proposed as flexible printed wiring boards with an electromagnetic wave shielding function.

(1) A flexible printed wiring board in which an undercoat layer, a shielding layer to which a conductive paste containing a metal powder is applied, and an overcoat layer are sequentially provided on a copper foil wiring circuit which is provided on a heat-resistant plastic film surface. A ground pattern of the copper foil wiring circuit and the shielding layer are electrically connected at an appropriate interval by penetrating through the undercoat layer (Japanese Patent Laid-Open Publication No. H2-33999)

(2) A flexible printed wiring board in which an electromagnetic wave shield film including a metal thin film layer and a conductive adhesive layer with a metal filler sequentially provided on one surface of a cover lay film is placed on a base film with an insulating layer insulating a printed circuit except for a part of a ground circuit such that the conductive adhesive layer is adhered to the insulating layer and the part of the ground circuit (Japanese Patent Laid-Open Publication No. 2000-269632)

(3) A flexible printed wiring board with a cover lay film in which an electromagnetic wave shielding layer is provided on one surface of the cover lay film, a resistor layer having a greater area than the electromagnetic wave shielding layer is provided on the other surface, and an electromagnetic wave noise flowing as a high-frequency current in the electromagnetic wave shielding layer flows as an overcurrent from an edge portion of the electromagnetic wave shielding layer to the resistor layer to be heat-dissipated in the resistor layer (Japanese Patent Laid-Open Publication No. 2009-283901).

SUMMARY OF THE INVENTION

The flexible printed wiring board of (1) has the following problems.

(i) Since the shielding layer containing the metal powder includes many different kinds of material interfaces, the shielding layer is fragile and does not have sufficient strength against repeated bending of the flexible wiring board.

(ii) The undercoat layer is necessary in order to insulate all of the copper foil wiring circuit except for a part of the ground pattern from the shielding layer, and the flexible printed wiring board thickens.

(iii) It is necessary to form a through-hole in a part of the undercoat layer in order to electrically connect the part of the ground pattern and the shielding layer, and it takes time and effort to process the through-hole.

Further, the flexible printed wiring board of (2) has the following problems.

(i) Since the conductive adhesive layer containing the metal filler has many different kinds of material interfaces, the conductive adhesive layer is fragile and does not have sufficient strength against repeated bending of the flexible wiring board.

(ii) The insulating layer is necessary in order to insulate the printed circuit except for the part of the ground circuit from the conductive adhesive layer, and the flexible printed wiring board thickens.

(iii) It is necessary to form a through-hole in a part of the insulating layer in order to electrically connect the part of the ground circuit and the conductive adhesive layer and it takes time and effort to process the through-hole.

Further, the flexible printed wiring board of (3) has the following problems.

(i) Since it is necessary to design the electromagnetic wave shielding layer to be smaller than the resistor layer, different electromagnetic wave shielding layers with different positions and, sizes should be designed for each type of flexible printed wiring board in which patterns of wiring conductors or like are different from each other. In accordance with this, the position and the size of the resistor layer should be designed. Further, alignment is necessary when a main body of the flexible printed wiring board and the cover lay film are bonded, and a flexible printed wiring board is therefore not practical.

(ii) It takes time for a high-frequency current to arrive at an edge portion of the electromagnetic wave shielding layer and to be attenuated by the resistor layer.

One embodiment of the present invention provides a cover lay film which has an electromagnetic wave shielding function. The cover lay film rapidly attenuates high-frequency current flowing in an electromagnetic wave shielding layer. The cover lay film has excellent bendability. The cover lay film allows thinning of a flexible printed wiring board to be achieved. The cover lay film makes designing the position or size of the electromagnetic wave shielding layer or a resistor layer based on the patterns of wiring conductors on the flexible printed wiring board unnecessary. The cover lay film makes alignment unnecessary when the cover lay film is bonded to a main body of the flexible printed wiring board. The cover lay film makes it unnecessary to connect the electromagnetic wave shielding layer to a ground circuit of the flexible printed wiring board. Also, another embodiment of the present invention provides a flexible printed wiring board including a cover lay film.

A cover lay film of one embodiment of the present invention includes an electromagnetic wave shielding layer formed of a conductive material; a resistor layer having a greater surface resistance than the electromagnetic wave shielding layer; and an insulating resin layer provided between the electromagnetic wave shielding layer and the resistor layer, wherein a plurality of openings penetrating in a thickness direction of the electromagnetic wave shielding layer are provided in the electromagnetic wave shielding layer.

According to the cover lay film of one embodiment of the present invention, a border between the opening and a non-opening of the electromagnetic wave shielding layer may overlap the resistor layer when viewed from a direction perpendicular to a surface of the cover lay film.

According to the cover lay film of one embodiment of the present invention, the total area of the openings may be equal to or less than 50% of the area of the insulating resin layer.

According to the cover lay film of one embodiment of the present invention, a maximum opening length L in the opening and a wavelength λ of an electromagnetic wave which is a shield target may satisfy Expression (1) below:

$$L < \lambda/4 \times (\mu_{eff} \times \epsilon_{eff})^{-1/2} \tag{1}$$

In the expression, $\mu_{eff}$ is an effective relative permeability and $\epsilon_{eff}$ is an effective relative permittivity.

According to the cover lay film of one embodiment of the present invention, a surface resistance of the electromagnetic wave shielding layer may be 0.01Ω to 5 and for surface resistance of the resistor layer to be 1Ω to 1000Ω.

According to the cover lay film of one embodiment of the present invention, the cover lay film may include an insulating protective layer on a top surface.

According to the cover lay film of one embodiment of the present invention, the cover lay film may include an insulating adhesive layer on a top surface.

A flexible printed wiring board of another embodiment of the present invention includes a main body of the flexible printed wiring board in which wiring conductors are formed on a surface of an insulating film; and a cover lay film of the present invention adhered to the main body of the flexible printed wiring board by the insulating adhesive layer.

Effects of the Invention

The cover lay film of one embodiment of the present invention has an electromagnetic wave shielding function. The cover lay film rapidly attenuates high-frequency current flowing in an electromagnetic wave shielding layer. The cover lay film has excellent bendability. The cover lay film allows thinning of a flexible printed wiring board to be achieved. The cover lay film makes designing the position or size of the electromagnetic wave shielding layer or a resistor layer based on the patterns of wiring conductors on the flexible printed wiring board unnecessary. The cover lay film makes alignment unnecessary when the cover lay film is bonded to a main body of the flexible printed wiring board. The cover lay film makes it unnecessary to connect the electromagnetic wave shielding layer to a ground circuit of the flexible printed wiring board.

Further, a flexible printed wiring board of another embodiment of the present invention has an electromagnetic wave shielding function. The cover lay film rapidly attenuates high-frequency current flowing in an electromagnetic wave shielding layer. The cover lay film has excellent bendability. The cover lay film allows thinning of a flexible printed wiring board to be achieved. The cover lay film makes designing the position or size of the electromagnetic wave shielding layer or a resistor layer based on the patterns of wiring conductors on the flexible printed wiring board unnecessary. The cover lay film makes it unnecessary to connect the electromagnetic wave shielding layer to a ground circuit of the flexible printed wiring board.

DETAILED DESCRIPTION OF THE INVENTION

In this disclosure, "facing" refers to a state in which at least a part overlaps when viewed from a direction perpendicular to a surface of a cover lay film.

In this disclosure, "thickness of a layer" refers to the thickness obtained by observing a cross-section of the layer using a transmission electron microscope or the like, and measuring and averaging the thicknesses of five parts of the layer.

In this disclosure, "surface resistance" is obtained as described below. Two thin film metal electrodes (10 mm in length, 5 mm in width, and 10 mm in distance between the electrodes) formed by depositing gold on a quartz glass is used. A measured object is placed on the electrodes, a region of 10 mm×20 mm of the measured object is pressed with a load of 50 g from above the measured object, the resistance between the electrodes is measured with measurement current of 1 mA or less, and this measurement value is deemed to be the surface resistance.

<Cover Lay Film>

Figure 1:
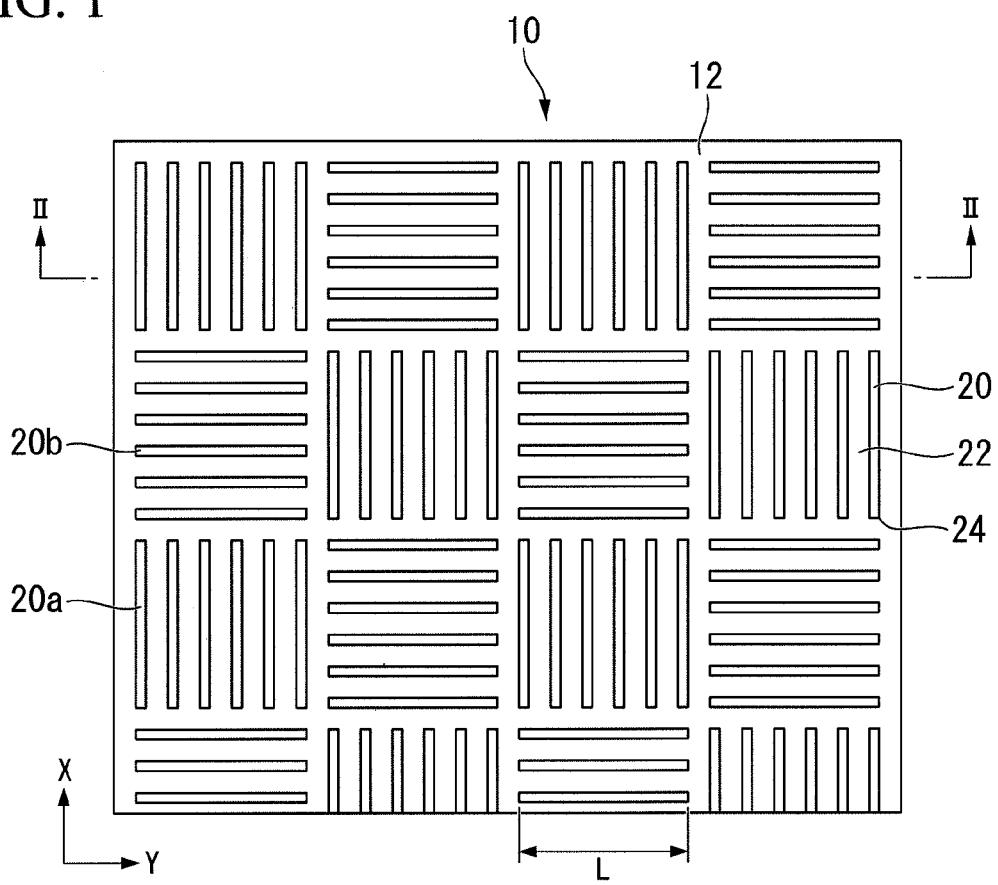
FIG. 1 is a plan view illustrating an example of a cover lay film according to one embodiment of the present invention.
Figure 2:
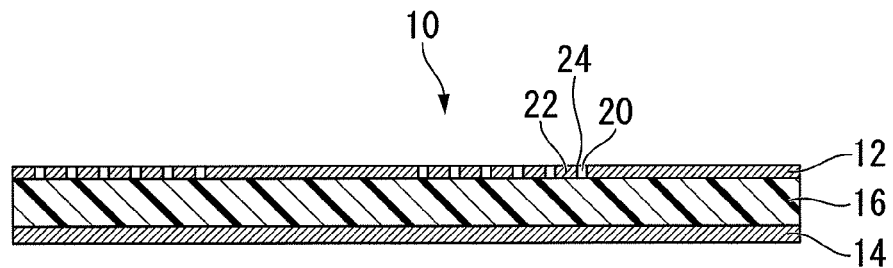
FIG. 2 is a cross-sectional view taken along line II-II in FIG. 1.

FIG. 1 is a plan view illustrating a first aspect of a cover lay film according to one embodiment of the present invention. FIG. 2 is a cross-sectional view taken along line II-II of FIG. 1. X axis is orthogonal with Y axis.

The cover lay film 10 of the first aspect includes an electromagnetic wave shielding layer 12, a resistor layer 14, and an insulating resin layer 16 provided between the electromagnetic wave shielding layer 12 and the resistor layer 14.

The electromagnetic wave shielding layer 12 has a plurality of slit-shaped openings 20 penetrating in a thickness direction of the electromagnetic wave shielding layer 12.

The openings 20 illustrated in FIG. 1 are rectangular but a shape of the openings 20 according to the present embodiment is not limited thereto. The shape of the openings 20 may be a shape having a major axis elongated along one direction. The shape of the openings 20 may be an elliptic shape having a major axis. The elliptic shape is not limited to an ellipse but a shape that is a circle elongated in one direction. The shape of the openings 20 may be a rectangle whose corners are rounded. The shapes of the openings 20 may be different from each other.

The plurality of openings 20 are divided into a first group in which a plurality of openings 20a extending in an X direction are arranged in parallel at predetermined intervals, and a second group in which a plurality of openings 20b extending in a Y direction are arranged in parallel at predetermined intervals. The first group and the second group are adjacent and alternately arranged in each of the X direction and the Y direction.

The openings 20 of the first group illustrated in FIG. 1 are located so as to be parallel to each other. The openings 20 of the second group illustrated in FIG. 1 are located so as to be parallel to each other. However, the present embodiment is not limited thereto. The openings 20 of the first group may be located so as to be substantially parallel to each other. The openings 20 of the second group may be located so as to be substantially parallel to each other. The permissible range from parallel is +X degrees to −X degrees.

The major axis of the openings 20 of the first group is located so as to be vertical to the major axis of the openings 20 of the second group in FIG. 1. However, the present embodiment is not limited thereto. The openings 20 may be located so that, when the major axis of the openings 20 of the first group is extended, the extended major axis crosses the major axis of the openings 20 of the second group. The crossing angle may be X degrees to −X degrees.

Since the resistor layer 14 is formed on one entire surface of the insulating resin layer 16, a border 24 between the opening 20 and a non-opening 22 necessarily overlaps the resistor layer 14 when viewed from a direction perpendicular to a surface of the cover lay film 10. The border 24 between the opening 20 and a non-opening 22 is also referred to as an edge of the opening 20 of the electromagnetic wave shielding layer 12.

The edge of the opening 20 located so as to necessarily overlap with the resistor layer 14 with the insulating resin layer 16 interposed therebetween. When the edge of the opening 20 is extended in a thickness-wise direction, the extended edge necessarily crosses the resistor layer 14.

Figure 3:
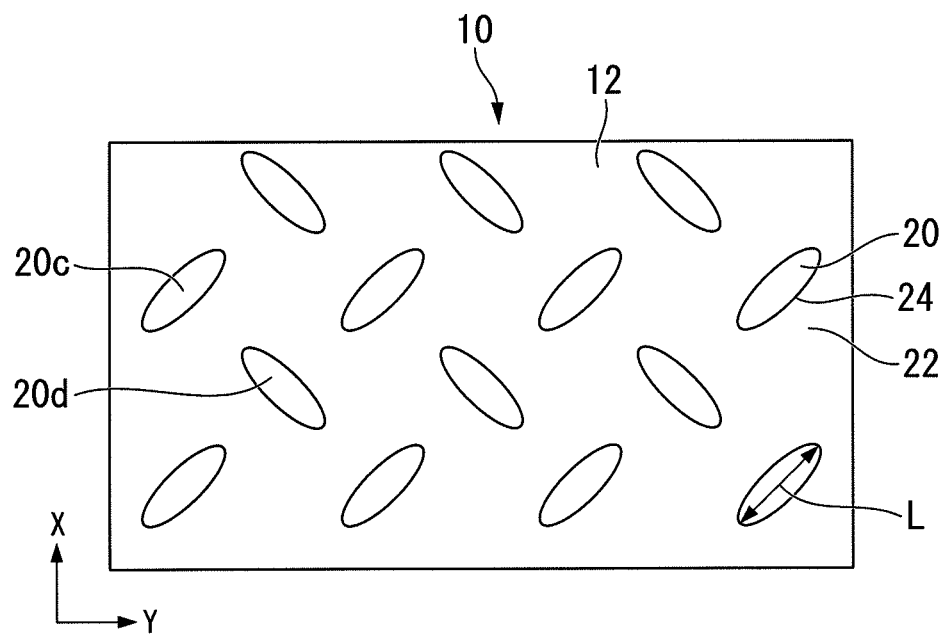
FIG. 3 is a plan view illustrating another example of the cover lay film according to one embodiment of the present invention.

FIG. 3 is a plan view illustrating a second aspect of the cover lay film of the present invention.

A cover lay film 10 of the second aspect includes an electromagnetic wave shielding layer 12, a resistor layer (not illustrated), and an insulating resin layer (not illustrated) provided between the electromagnetic wave shielding layer 12 and the resistor layer.

The electromagnetic wave shielding layer 12 has a plurality of elliptical openings 20 penetrating in a thickness direction of the electromagnetic wave shielding layer 12. The elliptic shape is not limited to an ellipse and includes shapes where a circle is elongated in one direction.

The shape of the opening 20 is the elliptic shape in FIG. 3 but the present embodiment is not limited thereto. The shape of the opening may be a rectangle as shown in FIG. 1. The shape of the opening may be a rectangle whose corners are rounded.

The plurality of openings 20 has a plurality of openings 20c whose major axis is tilted +45 degrees from an X direction and a plurality of openings 20d whose major axis is tilted +45 degree from a Y direction. The openings 20c and the openings 20d are alternately arranged in a direction tilted +45 degrees from the X direction and a direction tilted +45 degrees from the Y direction, respectively.

The major axis of the openings 20c in FIG. 3 is tilted +45 degrees from the X direction but the present embodiment is not limited thereto. The major axis of the openings 20c may be tilted form +0 degree to +90 degrees form the X direction. The major axis of the openings 20d is tilted −45 degrees from the X direction but the present embodiment is not limited thereto. The major axis of the openings 20d may be tilted from −0 degree to −90 degrees form the X direction.

Since the resistor layer is formed on one entire surface of the insulating resin layer, a border 24 between the opening 20 and a non-opening 22 necessarily overlaps the resistor layer when viewed from a direction perpendicular to a surface of the cover lay film 10. The border 24 between the opening 20 and a non-opening 22 is also referred to as a peripheral edge of the opening 20 of the electromagnetic wave shielding layer 12.

The edge of the opening 20 located so as to necessarily overlap with the resistor layer with the insulating resin layer interposed therebetween. When the edge of the opening 20 is extended in a thickness-wise direction, the extended edge necessarily crosses the resistor layer 14.

Figure 4:
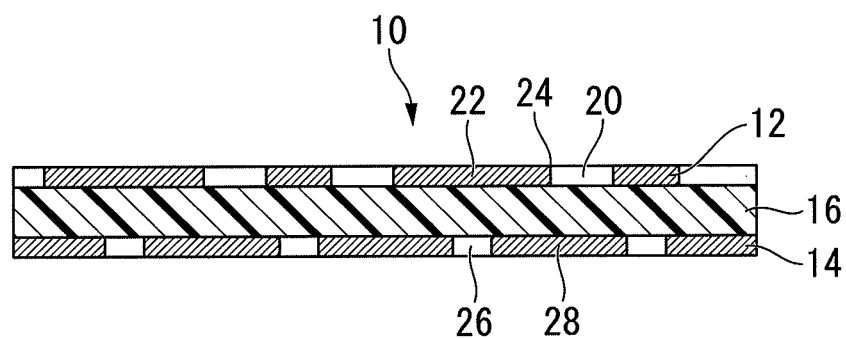
FIG. 4 is a cross-sectional view illustrating another example of the cover lay film according to one embodiment of the present invention.

FIG. 4 is a cross-sectional view illustrating a third aspect of the cover lay film of the present invention.

A cover lay film 10 of the third aspect includes an electromagnetic wave shielding layer 12, a resistor layer 14, and an insulating resin layer 16 provided between the electromagnetic wave shielding layer 12 and the resistor layer 14.

The electromagnetic wave shielding layer 12 has a plurality of openings 20 penetrating in a thickness direction of the electromagnetic wave shielding layer 12.

The resistor layer 14 has a plurality of empty portions 26 penetrating in a thickness direction of the resistor layer 14.

Since a non-empty portion 28 of the resistor layer 14 is formed to face the opening 20 of the electromagnetic wave shielding layer 12 and be slightly larger than the opening 20, a border 24 between the opening 20 and the non-opening 22 necessarily overlaps the non-empty portion 28 of the resistor layer 14 when viewed from a direction perpendicular to a surface of the cover lay film 10. The border 24 between the opening 20 and the non-opening 22 is also referred to as an edge of the opening 20 of the electromagnetic wave shielding layer 12.

The edge of the opening 20 located so as to necessarily overlap with the non-empty portion 28 of the resistor layer 14 with the insulating resin layer 16 interposed therebetween. When the edge of the opening 20 is extended in a thickness-wise direction, the extended edge necessarily crosses the non-empty portion 28 of the resistor layer 14.

The opening does not mean a space in which air exists but a missing part of the electromagnetic wave shielding layer 12.

Figure 5:
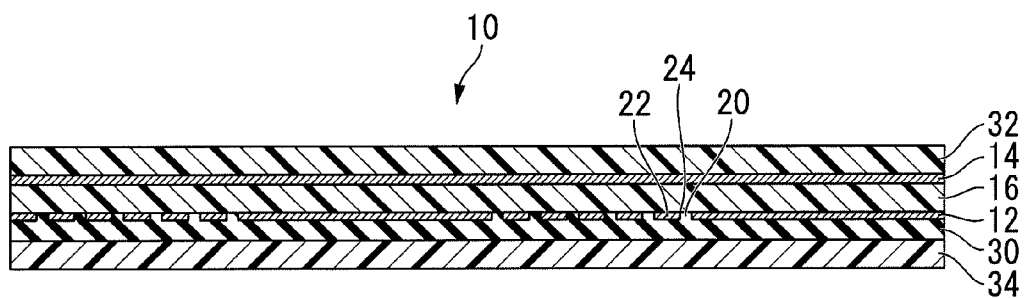
FIG. 5 is a cross-sectional view illustrating another example of the cover lay film according to one embodiment of the present invention.

FIG. 5 is a cross-sectional view illustrating a fourth aspect of the cover lay film of the present invention.

In the cover lay film 10 of the fourth aspect, an insulating adhesive layer 30 is provided on a surface of the electromagnetic wave shielding layer 12 of the cover lay film 10 of the first aspect, and an insulating protective layer 32 is provided on a surface of the resistor layer 14. The insulating adhesive layer 30 is formed so that the electromagnetic wave shielding layer 12 is sandwiched between the insulating resin layer 16 and the insulating adhesive layer 30. The insulating protective layer 32 is formed so that the resistor layer 14 is sandwiched between the insulating resin layer 16 and the insulating protective layer 32.

The insulating adhesive layer 30 is embedded in the opening 20 of the electromagnetic wave shielding layer 12.

A peelable film 34 is further provided on a surface of the insulating adhesive layer 30. The peelable film 34 is formed so that the insulating adhesive layer 30 is sandwiched between the electromagnetic wave shielding layer 12 and the peelable film 34.

Figure 6:
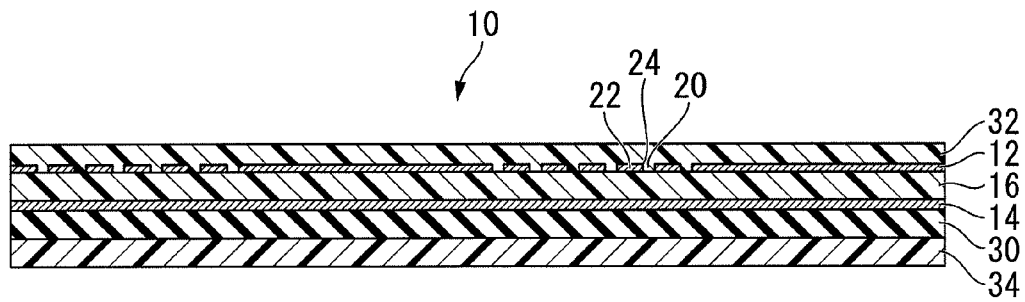
FIG. 6 is a cross-sectional view illustrating another example of the cover lay film according to one embodiment of the present invention.

FIG. 6 is a cross-sectional view illustrating a fifth aspect of the cover lay film of the present invention.

In the cover lay film 10 of the fifth aspect, an insulating adhesive layer 30 is provided on a surface of the resistor layer 14 of the cover lay film 10 of the first aspect, and an insulating protective layer 32 is provided on a surface of the electromagnetic wave shielding layer 12. The insulating adhesive layer 30 is formed so that the resistor layer 14 is sandwiched between the insulating resin layer 16 and the insulating adhesive layer 30. The insulating protective layer 32 is formed so that the electromagnetic wave shielding layer 12 is sandwiched between the insulating resin layer 16 and the insulating protective layer 32.

The insulating adhesive layer 30 is embedded in the opening 20 of the electromagnetic wave shielding layer 12.

A peelable film 34 is further provided on a surface of the insulating adhesive layer 30. The peelable film 34 is formed so that the insulating adhesive layer 30 is sandwiched between the resistor layer 14 and the peelable film 34.

(Electromagnetic Wave Shielding Layer)

The electromagnetic wave shielding layer 12 is a layer formed of a conductive material. The surface resistance of the electromagnetic wave shielding layer 12 is preferably 0.01Ω to 5Ω and more preferably 0.01Ω to 1Ω from the viewpoint of an electromagnetic wave shielding function.

The conductive material may include a metal (e.g., gold, silver, copper, aluminum or nickel); a conductive resin (e.g., a conductive paste) obtained by mixing conductive particles (e.g., metal particles) or conductive fibers (e.g., metal fibers or carbon nanotubes) with a resin; a conductive polymer (e.g., polythiophene or polypyrrole); or the like.

A form of the electromagnetic wave shielding layer 12 may include a metal deposition film, a metal foil, a film or a coating film formed of a conductive resin or a conductive polymer, or the like. The electromagnetic wave shielding layer 12 is preferably the metal deposition film from the viewpoint of bendability, thinning, durability, and conductivity.

The metal deposition film is formed using a physical vapor deposition method (an EB deposition method, an ion beam deposition method or a sputtering method). Since a dense film can be formed, the sputtering method is preferably used.

A thickness of the metal deposition film is preferably 50 nm to 200 nm from the viewpoint of a surface resistance value and a flex resistance characteristic.

A transmission attenuation characteristic of the electromagnetic wave shielding layer 12 is −80 dB or more, preferably −10 dB or less, and more preferably −40 dB or less. The transmission attenuation characteristic may be measured, for example, using a coaxial tube type shield effect measuring system (available from Keycom Inc.) that measures a shield effect with a plane wave, which conforms to ASTM D4935.

The electromagnetic wave shielding layer 12 has the plurality of openings 20 penetrating in a thickness direction of the electromagnetic wave shielding layer 12. There is no conductive material in the openings 20.

The total area of the openings 20 is preferably 1% to 50% of an area of the insulating resin layer 16, and more preferably 1 to 20%. The area of the insulating resin layer 16 means an area of a plane of the insulating resin layer which is substantially vertical to a thickness-wise direction of the electromagnetic wave shielding layer 12 and is in contact with the electromagnetic wave shielding layer 12. If the total area of the openings 20 is 50% or less of the area of the insulating resin layer 16, degradation of the electromagnetic wave shielding function is suppressed. If the total area of the openings 20 is 1% or more of the area of the insulating resin layer 16, high-frequency current flowing in the electromagnetic wave shielding layer 12 is easily attenuated.

It is desirable for a maximum opening length L in the opening 20 and a wavelength λ of an electromagnetic wave that is a shield target to satisfy Expression (1) below.

$$L < \lambda/4 \times (\mu_{eff} \times \epsilon_{eff})^{-1/2} \quad (1)$$

where $\mu_{eff}$ is an effective relative permeability, and $\epsilon_{eff}$ is an effective relative permittivity. The relative permeability and the relative permittivity are intrinsic values of its material. Since the material used for the electromagnetic wave shielding layer 12 in the present embodiment may be a composite material, the effective relative permeability and the effective relative permittivity are used in the Expression (1) in order to avoid a complexity.

$(\mu_{eff} \times \epsilon_{eff})^{1/2}$ is a wavelength compaction ratio k, and usually ranges from 0.4 to 0.8 when the opening 20 is a resin or a rubber elastic body, which will be described below, and the non-opening 22 is the conductive material described above.

If the maximum opening length L is λ/4×k or more, an electromagnetic wave having a wavelength λ passes through the opening 20 and an electromagnetic wave shielding function is degraded. If the frequency of the electromagnetic wave noise which is a target is 30 GHz, it is desirable for the maximum opening length L to be about 6 mm or less (when k=0.6). The lower limit of the maximum opening length L is 0.01 mm which is the lowest processable length.

It is desirable for two or more kinds of openings 20 having different directions of the maximum opening length L to be the openings 20 (e.g., the opening 20a and the opening 20b in FIG. 1 and the opening 20c and the opening 20d in FIG. 3). If there are two or more kinds of openings 20 having different directions of the maximum opening length L, it is possible to efficiently collect the electromagnetic wave noise incident on the electromagnetic wave shielding layer 12 on a border 24 of the opening 20 regardless of a direction of a polarized wave of the electromagnetic wave noise.

A distance between the adjacent openings 20 is preferably 1 mm to 30 mm and more preferably 2 mm to 10 mm. If the distance between the adjacent openings 20 is 1 mm or more, degradation of the electromagnetic wave shielding function is suppressed.

If the distance between the adjacent opening 20 is 30 mm or less, high-frequency current flowing in the electromagnetic wave shielding layer 12 is easily attenuated. The distance between the adjacent openings 20 is a shortest distance between the opening 20 and the adjacent opening 20.

(Resistance Layer)

The resistor layer 14 is a layer having a higher surface resistance than the electromagnetic wave shielding layer 12. The surface resistance of the resistor layer 14 is preferably 1Ω to 1000Ω, more preferably 2Ω to 500Ω and particularly preferably 10Ω to 200Ω from the viewpoint of the high-frequency current flowing in the electromagnetic wave shielding layer 12 being easily attenuated.

A material of the resistor layer 14 may include a metal, conductive ceramics or the like. When specific resistance of the material is low, the surface resistance may be adjusted to be high by thinning the resistor layer 14, but control of the thickness is difficult. A material having relatively high specific resistance is desirable as the material of the resistor layer 14. The material having resistance of from $1.5*10^{-6}\Omega$ to $3.0*10^{-4}\Omega$ is desirable as the material of the resistor layer 14.

The metal may include a ferromagnetic metal, a paramagnetic metal or the like.

The ferromagnetic metal may include iron, carbonyl iron, an iron alloy (Fe—Ni, Fe—Co, Fe—Cr, Fe—Si, Fe—Al, Fe—Cr—Si, Fe—Cr—Al, Fe—Al—Si, Fe—Pt or the like), cobalt, nickel, or an alloy thereof.

The paramagnetic metal may include gold, silver, copper, tin, lead, tungsten, silicon, aluminum, titanium, chromium, tantalum, molybdenum, an alloy thereof, an amorphous alloy, an alloy of the ferromagnetic metal or the like.

Among the material described above, the material having relatively low specific resistance is gold, silver, copper, and aluminum. When gold, silver, copper, or aluminum is used for the material of resistor layer 14, the surface resistance may be increased by thinning the resistor layer 14.

The metal is preferably nickel, an iron chromium alloy, tungsten, chromium, or tantalum from the viewpoint of resistance against oxidation. Practically, the metal is more preferably nickel, a nickel chromium alloy, an iron chromium alloy, tungsten, chromium or tantalum, and particularly preferably, nickel or a nickel alloy.

The conductive ceramics may include an alloy of a metal with one or more kinds of elements selected from the group consisting of boron, carbon, nitrogen, silicon, phosphorus and sulfur; an intermetallic compound; or a solid solution. Specifically, the conductive ceramics may include nickel nitride, titanium nitride, tantalum nitride, chromium nitride, titanium carbide, silicon carbide, chromium carbide, vanadium carbide, zirconium carbide, molybdenum carbide, tungsten carbide, chromium boride, molybdenum boride, chromium silicide, zirconium silicide, or the like.

The conductive ceramics may be easily obtained by using a gas containing one or more kinds of elements selected from the group consisting of nitrogen, carbon, silicon, boron, phosphorus and sulfur as a reactive gas in a physical vapor deposition method.

The resistor layer 14 is, for example, formed using a physical vapor deposition method (an EB deposition method, an ion beam deposition method, a sputtering method or the like).

The thickness of the resistor layer 14 is preferably 5 nm to 100 nm.

It is desirable for the resistor layer 14 to overlap the border 24 between the opening 20 and the non-opening 22 of the electromagnetic wave shielding layer 12 when viewed from a direction perpendicular to a surface of the cover lay film 10. Although this will be described in detail, it is due to the fact that, since high-frequency current remaining within the electromagnetic wave shielding layer 12 is concentrated on the border 24 due to an edge effect, it is necessary for the resistor layer 14 to be in a position as close to the plurality of borders 24 as possible in order to efficiently attenuate the high-frequency current.

Thus, in the first aspect of FIG. 2, the resistor layer 14 is provided over the entire surface in such a manner that the resistor layer 14 is necessarily under the border 24. Further, since the high-frequency current is not concentrated on a central part of the non-opening 22, it is unnecessary to arrange the resistor layer 14 in a part facing the central part of the non-opening 22 and the empty portion 26 may be formed, as shown in the third aspect of FIG. 4.

(Insulating Resin Layer)

The insulating resin layer 16 is a layer formed of a resin or a rubber elastic body. The surface resistance of the insulating resin layer 16 is preferably $1 \times 10^{6}\Omega$ or more.

The insulating resin layer 16 may include a layer formed of a film, a coating film formed by applying a coating material, or the like, and is preferably a layer formed of a film. The film is formed by, for example, extruding and casting and strength of the film is higher than the coating film which is formed by cross-linking a low-molecular-weight coating material.

The resin may include a polyimide, a liquid crystal polymer, a polyaramide, polyphenylene sulfide, polyamide imide, polyether imide, polyethylene naphthalate, polyethylene terephthalate, or the like which are heat-resistant.

The thickness of the insulating resin layer 16 is preferably 3 μm to 25 μm from the viewpoint of flexibility.

(Main Body of Cover Lay Film)

A main body of the cover lay film includes the electromagnetic wave shielding layer 12, the resistor layer 14 and the insulating resin layer 16 described above. The main body of the cover lay film with a thickness of 5 μm to 50 μm is preferable from the viewpoint of bendability. If the thickness of the main body of the cover lay film is 5 μm or more, the cover lay film 10 has sufficient strength and the insulation reliability increases. If the thickness of the main body of the cover lay film is 50 μm or less, the bendability of the flexible printed wiring board becomes good, it is difficult for the wiring conductor to be cracked due to repeated bending, and it is difficult for the wiring conductor to break.

(Insulating Adhesive Layer)

The insulating adhesive layer 30 adheres the main body of the cover lay film to the main body of the flexible printed wiring board.

The insulating adhesive is preferably an insulating adhesive in a semi-hardening state in which a rubber component (e.g., carboxyl-modified nitrile rubber) is added to an epoxy resin for giving flexibility. The insulating adhesive enters a fluidized state due to heating in hot pressing or the like and has an adhesive property by being activated again.

Spacer particles having a particle size of about 1 μm to 10 μm can also be included in the insulating adhesive in order to prevent the electromagnetic wave shielding layer 12 and the wiring conductor of the main body of the flexible printed wiring board from coming in contact with each other due to a flow of the insulating adhesive. The spacer particles may have other functions such as fluidity adjustment or flame retardance.

The thickness of the insulating adhesive layer 30 is preferably 5 to 40 μm and more preferably 10 to 20 μm for the insulating adhesive to enter a fluidized state and be sufficiently buried between the wiring conductors of the main body of the flexible printed wiring board.

(Insulating Protective Layer)

The insulating protective layer 32 is a layer located on a top surface of the flexible printed wiring board even when the cover lay film 10 is adhered to the main body of the flexible printed wiring board. The insulating protective layer 32 is a layer which protects the electromagnetic wave shielding layer 12 or the resistor layer 14 from external contact.

The insulating protective layer 32 is a layer formed of resin or a rubber elastic body. Surface resistance of the insulating protective layer 32 is preferably $1 \times 10^{6}\Omega$ or more and $1 \times 10^{14}\Omega$ or less.

The insulating protective layer 32 may include a layer formed of a film, a coating film formed by applying a coating material, or the like.

The resin may include the same resin as the resin of the insulating resin layer 16.

The thickness of the insulating protective layer 32 is preferably 3 μm to 25 μm from the viewpoint of flexibility.

(Operation and Effect)

The cover lay film 10 described above has an electromagnetic wave shielding function without connecting the electromagnetic wave shielding layer 12 to a ground circuit of the main body of the flexible printed wiring board for reasons to be described below. Therefore, it is unnecessary to give conductivity to the adhesive layer in order to connect the electromagnetic wave shielding layer 12 to the ground circuit. Although a disconnection has occurred by several thousand times of bending of the flexible printed wiring board of the prior art, the disconnection does not occur in the flexible printed wiring board of the present invention and the bendability is improved. Further, since the adhesive layer has no conductivity, an insulating layer for insulating between the adhesive layer and the wiring conductor of the main body of the flexible printed wiring board is unnecessary, and the thickness of the main body of the flexible printed wiring board can be reduced by a size equivalent to the thickness of the insulating layer, approximately 50 μm.

It may be considered unnecessary for the electromagnetic wave shielding layer 12 to be connected to the ground circuit of the flexible printed wiring board for the following reasons.

The electromagnetic wave shielding layer 12 not connected to the ground circuit serves as an antenna The electromagnetic wave noise flows as a high-frequency current within the electromagnetic wave shielding layer 12 and is released again from the border 24 which is a an edge. At the time of re-release, since a change in an electromagnetic field occurs on the border 24 and an overcurrent caused by a magnetic field change flows in the resistor layer 14 to be heat-dissipated, energy of the electromagnetic wave noise may be considered to be attenuated.

Therefore, it is desirable for the resistor layer 14 to be in a position as close to the border 24 as possible, namely, for an overcurrent caused by the electromagnetic field change occurring from the border 24 to efficiently flow in the resistor layer 14 by causing the border 24 to be in the resistor layer 14 when viewed from a direction perpendicular to the surface of the cover lay film 10.

Also, since there are the plurality of openings 20 in which the electromagnetic wave shielding layer 12 is omitted, it is possible to rapidly attenuate the high-frequency current flowing in the electromagnetic wave shielding layer 12. Further, since there are a plurality of independent openings 20 not affected by a pattern of the wiring conductor of the main body of the flexible printed wiring board or the like, it is possible to omit efforts such as alignment when the cover lay film is bonded to the main body of the flexible printed wiring board.

<Flexible Printed Wiring Board>

Figure 7:
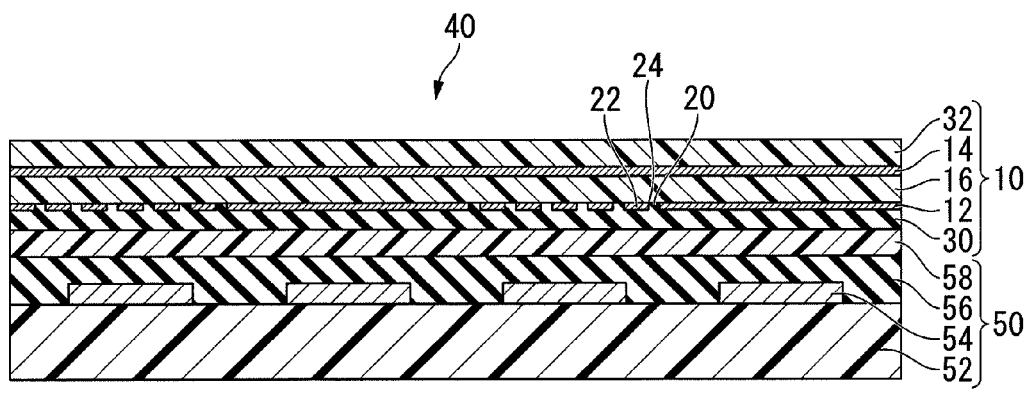
FIG. 7 is a cross-sectional view illustrating an example of a flexible printed wiring board according to another embodiment of the present invention.

FIG. 7 is a cross-sectional view illustrating a first aspect of a flexible printed wiring board of the present invention.

A flexible printed wiring board 40 of the first aspect includes a main body 50 of the flexible printed wiring board and the cover lay film 10 of the fourth aspect. The main body 50 of the flexible printed wiring board includes an insulating film 52, wiring conductors 54, a second insulating adhesive layer 56, and a second insulating resin layer 58. The wiring conductors 54 are formed on a surface of the insulating film 52. The second insulating resin layer 58 is adhered on the wiring conductors 54 by the second insulating adhesive layer 56. The cover lay film 10 of the fourth aspect is adhered on a surface of the second insulating resin layer 58 of the main body 50 of the flexible printed wiring board by the insulating adhesive layer 30.

In the flexible printed wiring board 40 of the first aspect, the electromagnetic wave shielding layer 12 of the cover lay film 10 is provided on the inward side relative to the resistor layer 14. In other words, the electromagnetic wave shielding layer 12 is provided on the side of the main body 50 of the flexible printed wiring board relative to the resistor layer 14. The distance between the electromagnetic wave shielding layer 12 and the main body 50 of the flexible printed wiring board is less than the distance between the resistor layer 14 and the main body 50 of the flexible printed wiring board. Therefore, most of electromagnetic wave noise arriving from the outside (from the top in FIG. 7) passes through the resistor layer 14 since the surface resistance of the resistor layer 14 is high, is reflected by the electromagnetic wave shielding layer 12, and does not arrive at the internal wiring conductors 54. High-frequency current remaining in the electromagnetic wave shielding layer 12 is concentrated on a border 24 and is heat-dissipated by the resistor layer 14. Since the resistor layer 14 is provided apart from the wiring conductors 54, the resistor layer 14 does not affect the high frequency signal flowing in the wiring conductors 54 and does not attenuate the high frequency signal.

Figure 8:
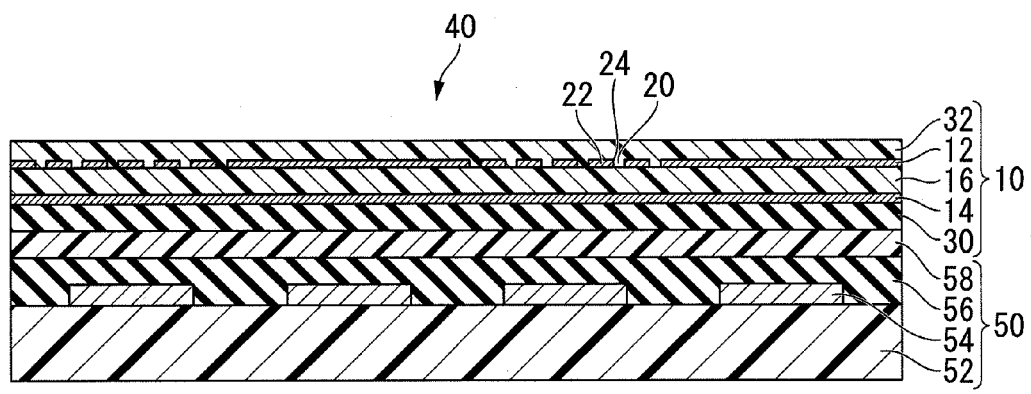
FIG. 8 is a cross-sectional view illustrating another example of the flexible printed wiring board according to another embodiment of the present invention.

FIG. 8 is a cross-sectional view illustrating a second aspect of the flexible wiring board of the present invention.

The flexible printed wiring board 40 of the second aspect includes a main body 50 of the flexible printed wiring board and the cover lay film 10 of the fifth aspect. The main body 50 of the flexible printed wiring board includes an insulating film 52, wiring conductors 54, a second insulating adhesive layer 56, and a second insulating resin layer 58. The wiring conductors 54 are formed on a surface of the insulating film 52. The second insulating resin layer 58 is adhered on the wiring conductors 54 by the second insulating adhesive layer 56. The cover lay film 10 of the fifth aspect is adhered on a surface of the second insulating resin layer 58 of the main body 50 of the flexible printed wiring board by an insulating adhesive layer 30.

In the flexible printed wiring board 40 of the second aspect, the electromagnetic wave shielding layer 12 of the cover lay film 10 is provided on the outside side relative to the resistor layer 14. In other words, the distance between the electromagnetic wave shielding layer 12 and the main body 50 of the flexible printed wiring board is greater than the distance between the resistor layer 14 and the main body 50 of the flexible printed wiring board. An edge of the flexible printed wiring board 40 is not covered with the cover lay film 10 for solder connection, connector connection, mounting of parts or the like (not illustrated). A part other than the edge is a bendable part and is usually bent about 180 degrees with a bending outer diameter of 1 to 3 mm. Since there is the electromagnetic wave shielding layer 12 having the openings 20 on an outer side to which a stress is applied at the time of bending, stress relaxation can be performed and the flexible printed wiring board 40 of the second aspect has excellent bendability.

Figure 10:
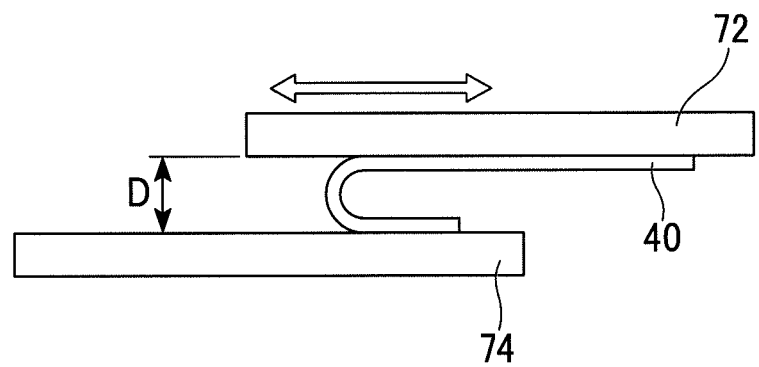
FIG. 10 is a diagram illustrating a bendability evaluation method.

The bending outer diameter is obtained as described below. As illustrated in FIG. 10, the flexible printed wiring board 40 is fixed to two sliding boards 72 and 74 so that the flexible printed wiring board 40 is bent. The distance D between the board 72 and the board 74 is a bending outer diameter.

(Main Body of Flexible Printed Wiring Board)

In the main body 50 of the flexible printed wiring board, a copper foil of a copper-clad laminate is etched using an known etching method to form the wiring conductors 54 having a desired shape, and a normal cover lay film (a laminate of the second insulating adhesive layer 56 and the second insulating resin layer 58) is adhered on the wiring conductors 54.

The copper-clad laminate may include a copper-clad laminate having a two- to three-layer structure in which a copper foil is bonded to at least one surface of the insulating film 52 with an adhesive. The copper-clad laminate may include a copper-clad laminate having a 2-layer structure in which a resin solution or the like forming the insulating film 52 is cast on a copper foil.

(Insulating Film)

The surface resistance of the insulating film 52 is preferably $1 \times 10^6 \Omega$ or more and $1 \times 10^{14} \Omega$ or less.

The insulating film 52 is preferably a film having heat resistance, and is more preferably a polyimide film, a liquid crystal polymer film, or like.

The thickness of the insulating film 52 is preferably 5 μm to 50 μm. The thickness is more preferably 6 μm to 25 μm and particularly preferably 10 μm to 25 μm from the viewpoint of bendability.

(Wiring Conductor)

The wiring conductor 54 is obtained by patterning the copper foil of the copper-clad laminate in a desired shape.

The copper foil includes a rolled copper foil, an electrolytic copper foil or the like, and is preferably the rolled copper foil from the viewpoint of bendability.

The thickness of the copper foil is preferably 3 μm to 18 μm.

(Second Insulating Resin Layer)

It is desirable for the electromagnetic wave shielding layer 12 and the resistor layer 14 to be located between the insulating protective layer 32 and the second insulating resin layer 58 and to not come in contact with the wiring conductors 54 of the flexible printed wiring board 40, an external conductor, and the like.

The second insulating resin layer 58 is a layer formed of a resin or a rubber elastic body. Surface resistance of the second insulating resin layer 58 is preferably $1 \times 10^6 \Omega$ or more and $1 \times 10^{14} \Omega$ or less.

The second insulating resin layer 58 is preferably a layer formed of a film, and may be the same as the insulating resin layer 16.

(Second Insulating Adhesive Layer)

An insulating adhesive layer of the second insulating adhesive layer 56 may include the same insulating adhesive layer as the insulating adhesive layer of the insulating adhesive layer 30.

For an insulating adhesive to enter a fluidized state and be sufficiently buried between the wiring conductors 54 of the flexible printed wiring board 40, the thickness of the second insulating adhesive layer 56 is preferably 5 μm to 40 μm and more preferably 10 μm to 20 μm.

The thickness of the second insulating adhesive layer 56 is preferably 3 μm to 25 μm from the viewpoint of flexibility.

(Operation and Effect)

Since the cover lay film 10 is adhered to the main body 50 of the flexible printed wiring board, the flexible printed wiring board 40 has a electromagnetic wave shielding function for the reasons described above. The flexible printed wiring board 40 rapidly attenuates high-frequency current flowing in the electromagnetic wave shielding layer 12. The flexible printed wiring board 40 has excellent bendability. The flexible printed wiring board 40 allows thinning thereof to be achieved. The flexible printed wiring board 40 makes designing the position or size of the electromagnetic wave shielding layer 12 or the resistor layer 14 based on patterns of the wiring conductors 54 unnecessary. The flexible printed wiring board 40 makes connecting the electromagnetic wave shielding layer 12 to the ground circuit unnecessary.

EMBODIMENTS

Hereinafter, embodiments will be shown. Further, the present invention is not limited to such embodiments.

(Thickness of Each Layer)

A cross-section of the cover lay film was observed using a transmission electron microscope (H9000NAR available from Hitachi, Ltd.), and the thicknesses of five parts of each layer were measured and averaged.

(Surface Resistance)

Two thin film metal electrodes (10 mm in length, 5 mm in width, and 10 mm in distance between the electrodes) formed by depositing gold on a quartz glass were used. A measured object was placed on the electrodes, a region of 10 mm×20 mm of the measured object was pressed with a load of 50 g from above the measured object, the resistance between the electrodes was measured with measurement current of 1 mA or less, and this measurement value was deemed as the surface resistance.

(Evaluation of Electromagnetic Wave Shielding Function)

Figure 9:
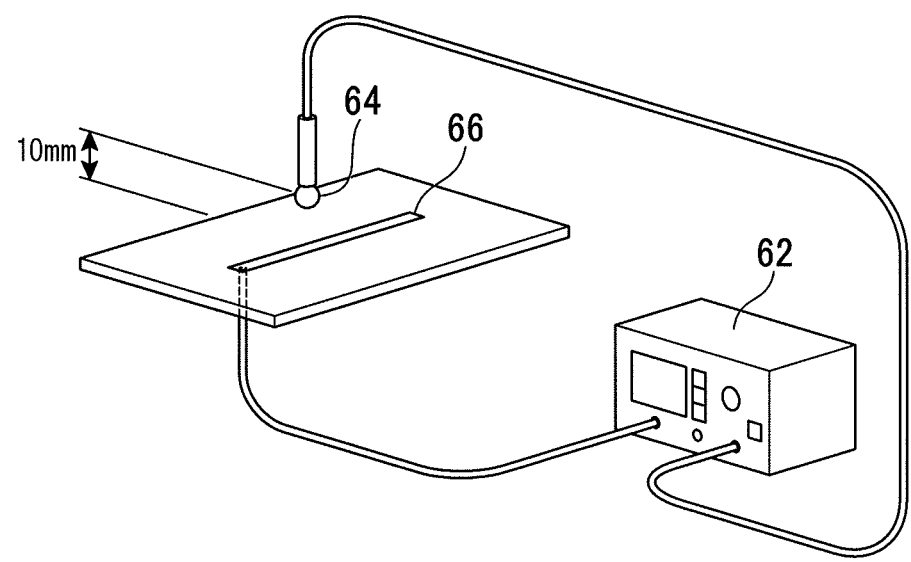
FIG. 9 is a configuration diagram illustrating a system used for evaluation of an electromagnetic wave shielding function.

The electromagnetic wave shielding function of the cover lay film 10 was evaluated using a system illustrated in FIG. 9. The system illustrated in FIG. 9 included a tracking generator with a built-in spectrum analyzer 62; a shield loop antenna 64 (loop diameter: 8 mm, and the distance from a loop center to a microstrip line 66: 10 mm); and the microstrip line 66 (Z: 50Ω, board size: 50 mm×80 mm, and the entire surface of a back surface was grounded) having a line length of 55 mm. The shield loop antenna 64 was connected to a tracking generator with a built-in spectrum analyzer 62 through a coaxial cable. An electromagnetic wave noise (ranging from 1 MHz to 2 GHz) generated from the shield loop antenna 64 was received by the microstrip line 66, and a reception characteristic was measured using the spectrum analyzer 62 in a state in which the microstrip line 66 was or was not covered with the cover lay film 10. An absorbing material based on a magnetic material was placed on a part of the microstrip line 66 that could not be covered with the cover lay film 10.

(Evaluation of Bendability)

As illustrated in FIG. 10, the flexible printed wiring board 40 was fixed to two sliding boards 72 and 74, and the resistance value between end electrodes was monitored. A distance D between the board 72 and the board 74 was a bending outer diameter (=bending radius×2). A slide condition was such that a stroke was 40 mm, the number of cycles was 60 times/minute, and the number of cycles in which an initial resistance value was doubled was deemed to be the number of breaks.

Embodiment 1

Aluminum was physically deposited on the surface of a polyimide film (the insulating resin layer 16; surface resistance: $2 \times 10^{16} \Omega$) of 80 mm×80 mm×thickness 12.5 μm using a magnetron sputtering method to form the electromagnetic wave shielding layer 12 (surface resistance: 0.2Ω) with a thickness of 120 nm. A part of the electromagnetic wave shielding layer 12 was removed using a laser etching scheme to form a plurality of slit-shaped openings 20 of 0.2 mm×5 mm at intervals of 1 mm as illustrated in FIG. 1. The total area of the openings 20 was 20% of the area of the insulating resin layer 16. Further, when the frequency of an electromagnetic wave which was a shield target ranged from 1 MHz to 3 GHz, $\lambda/4\times(\mu_{eff}\times\epsilon_{eff})^{-1/2}$ was $4.5\times10$ to $4.5\times10^4$ mm, and was greater than a maximum opening length L (5 mm) in the opening 20.

Nickel was physically deposited on a surface of the insulating resin layer 16 on the side opposite to the electromagnetic wave shielding layer 12 using a magnetron sputtering method to form the resistor layer 14 (surface resistance: 20Ω) of 80 mm×80 mm×thickness 20 nm, resulting in the cover lay film 10 illustrated in FIG. 2.

Further, an insulating adhesive made of a nitrile rubber modified epoxy resin was applied on a surface of the electromagnetic wave shielding layer 12 in such a manner that the dry film thickness was 20 µm, to form the insulating adhesive layer 30.

A sample of 20 mm×20 mm was cut out from the cover lay film 10.

Figure 11:
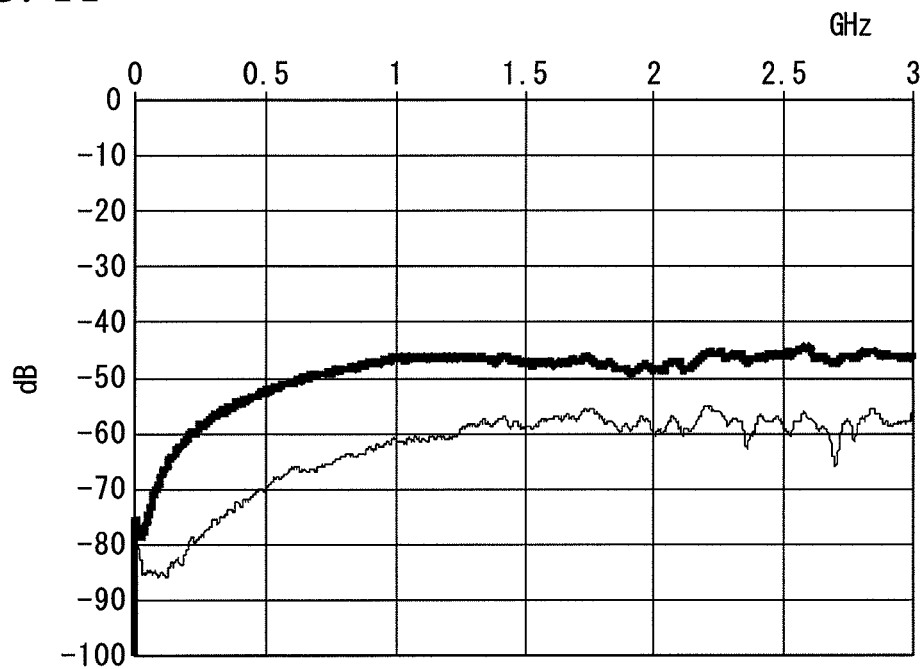
FIG. 11 is a graph illustrating a reception characteristic measured when evaluation of an electromagnetic wave shielding function is performed in embodiment 1.

The insulating adhesive layer 30 of the sample was pressed against a microstrip board illustrated in FIG. 9, and the cover lay film 10 was placed on the microstrip line 66. A swept high frequency signal ranging from 1 MHz to 3 GHz was output from the shield loop antenna 64 and the reception characteristic was measured. The reception characteristic is illustrated by a solid line in FIG. 11. Further, the reception characteristic (blank) in a state in which the microstrip line 66 was not covered with the cover lay film 10 is illustrated by a bold line in FIG. 11. In a state in which the microstrip line 66 was covered with the cover lay film 10, the reception characteristic was attenuated by several dB to a maximum of 17 dB in comparison with the state in which the microstrip line 66 was not covered with the cover lay film 10.

A copper foil of a copper-clad laminate (20 mm×120 mm) in a 2-layer structure including a polyimide film (the insulating film 52; surface resistance: $2\times10^{16}$Ω) with a thickness of 12 µm and a rolled copper foil with a thickness of 18 µm was etched to form the wiring conductors 54 with a line width of 0.5 mm and a line length of 120 mm. A polyimide film (the second insulating resin layer 58; surface resistance: $2\times10^{16}$Ω) of 20 mm×100 mm×thickness 10 µm was adhered to the wiring conductors 54, except for the end electrode, via the second insulating adhesive layer 56 (surface resistance: $3\times10^{13}$Ω) with a thickness of 25 µm formed of a nitrile rubber modified epoxy resin and having by hot pressing. The cover lay film 10 was adhered thereto by the insulating adhesive layer 30, resulting in the flexible printed wiring board 40 illustrated in FIG. 7 (however, the insulating protective layer 32 was not provided). The electromagnetic wave shielding layer 12 was provided to cover the wiring conductors 54, but not grounded to the wiring conductors 54.

The flexible printed wiring board 40 was fixed to the board 72 and the board 74 illustrated in FIG. 10, the distance D was set to be 1 mm (the bending radius was 0.5 mm), the board was slid with a stroke of 30 mm, and the number of breaks was measured with a number of cycles of 40 times/min. The number of breaks was 580000.

Embodiment 2

Polyamide-imide was casting-formed on a surface of a release carrier film formed of a polyester film of 50 mm×80 mm×thickness 50 µm to form the insulating protective layer 32 (surface resistance: $4\times10^{14}$Ω) with a thickness of 5 µm. Copper was physically deposited on a surface of the insulating protective layer 32 using an EB deposition method to form the electromagnetic wave shielding layer 12 (surface resistance: 0.5Ω) of 50 mm×80 mm×thickness 100 nm. A part of the electromagnetic wave shielding layer 12 was removed using a laser etching method to form a plurality of elliptical openings 20 with a minor axis which is 4 mm long and a major axis which is 8 mm long at intervals of 6 mm as illustrated in FIG. 3. The total area of the openings 20 was 15% of the area of the insulating resin layer 16. Further, when a frequency of the electromagnetic wave which was a shield target ranged from 1 MHz to 3 GHz, $\lambda/4\times(\mu_{eff}\times\epsilon_{eff})^{-1/2}$ was $4.5\times1$ 0 to $4.5\times10^4$ mm and was greater than a maximum opening length L (8 mm) in the opening 20.

A polyamide imide solution was applied on the surface of the electromagnetic wave shielding layer 12 and dried to form the insulating resin layer 16 (surface resistance: $4\times10^{14}$Ω) with a thickness of 5 µm. Nickel was physically deposited on the insulating resin layer 16 using a reactive sputtering method using a reactive gas containing a nitrogen gas to thereby form a nickel nitride deposition film (the resistor layer 14; surface resistance: 78Ω) of 50 mm×80 mm×thickness 20 nm.

Furthermore, an insulating adhesive made of a nitrile rubber modified epoxy resin was applied on a surface of the electromagnetic wave shielding layer 12 in such a manner that a dry film thickness was 20 µm to form the insulating adhesive layer 30, resulting in the cover lay film 10 illustrated in FIG. 6 (however, the peelable film 34 is not provided).

Figure 12:
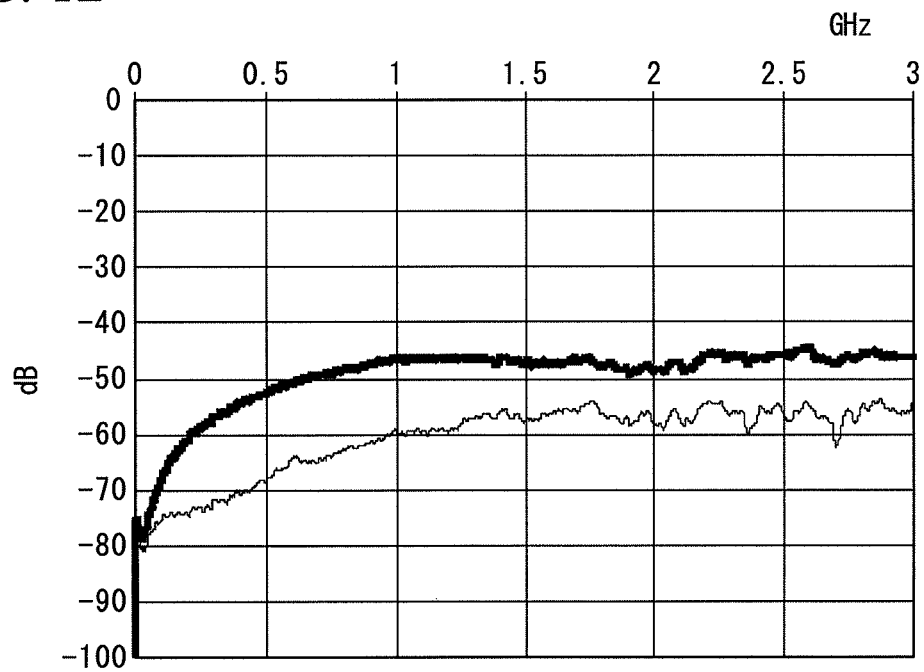
FIG. 12 is a graph illustrating a reception characteristic measured when evaluation of an electromagnetic wave shielding function is performed in embodiment 2.

The electromagnetic wave shielding function was evaluated similarly to Embodiment 1. The reception characteristic is illustrated by a solid line in FIG. 12. The reception characteristic (blank) in a state in which the microstrip line 66 was not covered with the cover lay film 10 is illustrated by a bold line in FIG. 12. In a state in which the microstrip line 66 was covered with the cover lay film 10, the reception characteristic was attenuated from several dB to a maximum of 15 dB in comparison with a state (blank) in which the microstrip line 66 was not covered with the cover lay film 10.

The flexible printed wiring board 40 in which the cover lay film 10 was adhered to the main body 50 of the flexible printed wiring board as illustrated in FIG. 8 was obtained, similar to Embodiment 1. After the cover lay film 10 was adhered, the carrier film formed of a polyester film was peeled off and removed. The electromagnetic wave shielding layer 12 was provided to cover the wiring conductors 54, but not grounded to the wiring conductors 54.

The bendability of the flexible printed wiring board 40 was evaluated in the same manner as in the Embodiment 1. The number of breaks was 770000.

Comparative Example 1

Figure 13:
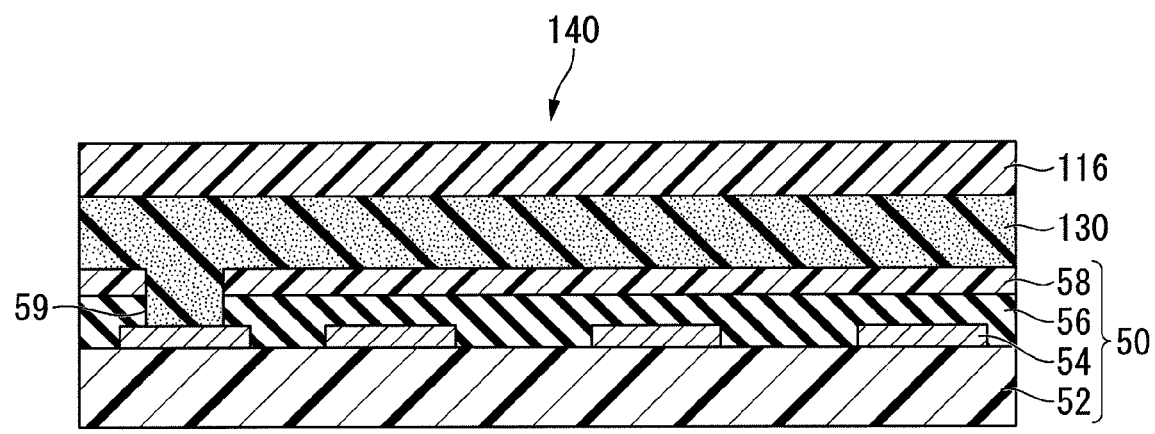
FIG. 13 is a cross-sectional view illustrating an example of a flexible printed wiring board of the related art.

A flexible printed wiring board 140 having a structure illustrated in FIG. 13 was made as follows.

A flexible printed wiring board main body 50 is formed in the same manner as the flexible printed wiring board 40 in Embodiment 1 except that the through-hole 59 was formed in a second insulating adhesive layer 56 and a second insulating resin layer 58 on the wiring conductors 54. A polyimide film (an insulating resin layer 116) with a thickness of 12.5 µm was adhered to wiring conductors 54 through a second insulating resin layer 58 and a through-hole 59 via a conductive adhesive layer 130 filled with silver powder, by hot pressing. The distance between the insulating resin layer 116 and the second insulating resin layer 58 was 13 µm.

Figure 14:
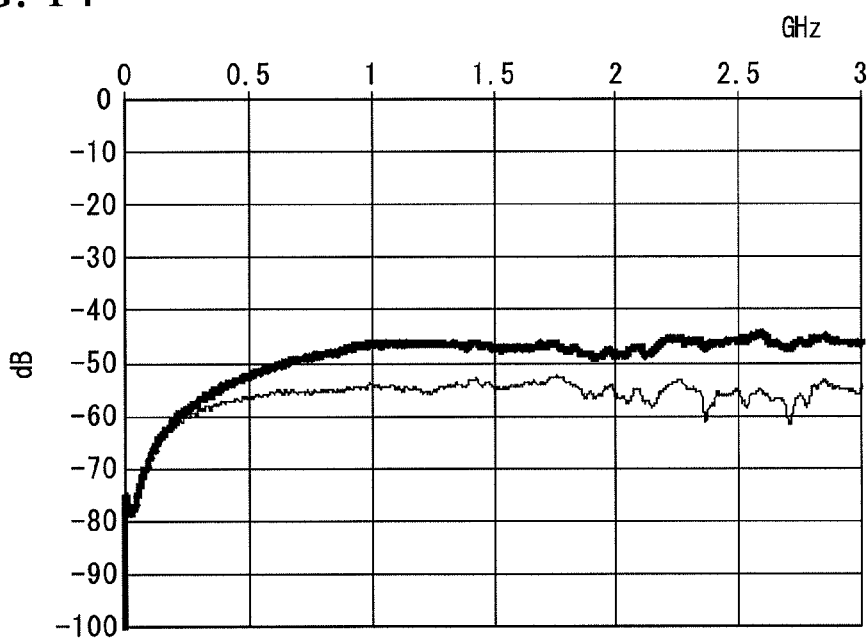
FIG. 14 is a graph illustrating a reception characteristic measured when evaluation of an electromagnetic wave noise suppressing function is performed in Comparative Example 1.

Evaluation of an electromagnetic wave shielding function was performed similarly to Embodiment 1 except that a grounded probe was brought into contact with the conductive adhesive layer 130 having a function as an electromagnetic wave shielding layer and grounded. A reception characteristic is illustrated by a solid line in FIG. 14. The reception characteristic (blank) in a state in which the microstrip line 66 was not covered with the cover lay film 10 is illustrated by a bold line in FIG. 14. The electromagnetic wave shielding function was low in a low frequency domain.

The bendability of the flexible printed wiring board 140 was evaluated similarly to Embodiment 1. The number of breaks was less than 10000 and was inferior to Embodiment 1.

INDUSTRIAL AVAILABILITY

The flexible printed wiring board including the cover lay film of the aspects of the present invention is useful as a flexible printed wiring board for a small electronic device, such as a cellular phone, a digital camera, a game device, a laptop PC or an optical module.

What is claimed is:

1. A cover lay film comprising:
   an electromagnetic wave shielding layer formed of a conductive material;
   a resistor layer having a greater surface resistance than the electromagnetic wave shielding layer; and
   an insulating resin layer provided between the electromagnetic wave shielding layer and the resistor layer,
   wherein a plurality of openings penetrating in a thickness direction of the electromagnetic wave shielding layer are provided in the electromagnetic wave shielding layer, and
   a maximum opening length L in the opening and a wavelength λ of an electromagnetic wave which is a shield target satisfy Expression (1) below:

$$L < \lambda/4 \times (\mu_{eff} \times \epsilon_{eff})^{-1/2} \quad (1)$$

where $\mu_{eff}$ is an effective relative permeability and $\epsilon_{eff}$ is an effective relative permittivity, and $(\mu_{eff} \times \epsilon_{eff})^{-1/2}$ represents a wavelength compaction ratio k.

2. The cover lay film according to claim 1, wherein a border between the opening and a non-opening of the electromagnetic wave shielding layer overlaps the resistor layer when viewed from a direction perpendicular to a surface of the cover lay film.

3. The cover lay film according to claim 1, wherein a total area of the openings is equal to or less than 50% of an area of the insulating resin layer.

4. The cover lay film according to claim 1, wherein:
   a surface resistance of the electromagnetic wave shielding layer is 0.01Ω to 5Ω, and
   a surface resistance of the resistor layer is 1Ω to 1000Ω.

5. The cover lay film according to claim 1, further comprising an insulating protective layer on a top surface.

6. The cover lay film according to claim 1, comprising an insulating adhesive layer on a top surface.

7. A flexible printed wiring board comprising:
   a main body comprising an insulating film and wiring conductors, the wiring conductors being formed on a surface of the insulating film;
   a cover lay film according to claim 6 being adhered to the main body by the insulating adhesive layer.

* * * * *